TRANSISTOR OSCILLATOR

Filed Dec. 9, 1964 2 Sheets-Sheet 1

INVENTORS
Noboru Kozuma
Kin Fukawa
BY ( $C_b$ TEMPERATURE SENSITIVE )

INVENTORS
Noboru Kozuma
Ken Fukawa
BY

United States Patent Office
3,297,962
Patented Jan. 10, 1967

3,297,962
TRANSISTOR OSCILLATOR

Noboru Kozuma, Nakano-ku, Tokyo-to, and Ken Fukawa Kitatama-gun, Tokyo-to, Japan, assignors to Kabushiki Kaisha Hitachi Seisakusho, Tokyo-to, Japan, a joint-stock company of Japan Filed Dec. 9, 1964, Ser. No. 417,066
Claims priority, application Japan, Dec. 12, 1963, 38/67,039; June 4, 1964, 39/31,601
3 Claims. (Cl. 331—117)

This invention relates to transistor oscillators and more particularly to grounded-base transistor oscillators.

More specifically, it is a general object of the invention to provide a new and improved grounded-base transistor oscillator of the Colpitts type for high frequencies wherein, by the insertion of a suitable inductance element or a capacitance element in the base circuit of the transistor, a substantial increase in the oscillator output power and an extension of the oscillation frequency range to a high region are attained, and, moreover, the said elements are caused to have suitable temperature coefficients whereby the oscillation frequency is stabilized with respect to temperature variations.

The foregoing object as well as other objects and advantages as will presently become apparent have been achieved by the present invention, the nature, principle, and details will be best understood from the following detailed description taken in conjunction with the accompanying drawings in which like parts are designated by like reference characters, and in which.

Figure 1:
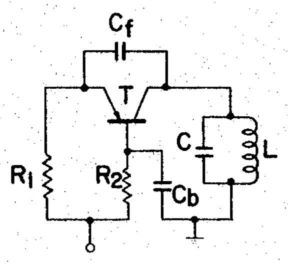
FIG. 1 is a circuit diagram of an example of a transistorized Colpitts oscillator of known arrangement.

The example of a Colpitts oscillator of known circuit arrangement shown in FIG. 1 comprises a transistor T, bias resistance $R_1$ and $R_2$ of the transistor T, a capacitor $C_f$ for feedback impedance, an inductance L and capacitor element C constituting a resonant tank circuit, which ordinarily consists of a cavity resonator for the ultra-high-frequency band, and a bias capacitor $C_b$. In a conventional oscillator circuit, the impedance of this bias capacitor $C_b$ is selected to be almost zero with respect to the oscillation frequency.

In a known oscillator circuit of the above described arrangement, however, inconvenience is caused, in general, by a lowering of the oscillator output power accompanying increase in the oscillation frequency and a restriction of the upper limit of useable frequency by the susceptance due to the inductance L, capacitor C, and the output admittance of the transistor. The reason for this difficulty will be apparent from the following consideration, which is presented since it forms the basis of and leads to the principle of the present invention.

Figure 2:
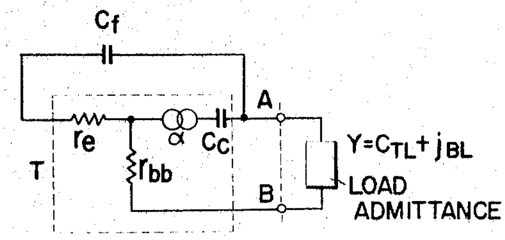
FIG. 2 is an equivalent circuit diagram of the oscillator shown in FIG. 1.

Referring to FIG. 2, which shows a high-frequency equivalent circuit of the oscillator shown in FIG. 1, the equivalent circuit comprises a feedback impedance capacitor $C_f$, an equivalent circuit T enclosed by dotted line of the transistor, and a load admittance Y composed of the inductance component L and capacitance component C, the load admittance Y being expressable by $Y=G_1+jB_1$.

If the output admittance $Y_o$ of the transistor is expressed by $Y_o=g_o+jb_o$ ($g_o$ being a negative conductance in the case of an oscillator), the condition for oscillation of the oscillation circuit of FIG. 1 will be expressable by the relationship $|g_o|>G_1$.

The condition for the oscillation frequency at the time will be expressable by $b_o+B_1=0$. If the feedback impedance and load admittance are caused to be constant, the condition for oscillation and the condition for the oscillation frequency of this circuit will be automatically determined by the transistor. Therefore, in order to increase the oscillation output power of this oscillation circuit and, at the same time, to bring the oscillation frequency up to a high region, it is necessary to increase the negative conductance $g_o$ of the transistor and also to reduce the output susceptance $b_o$. Actually, however, there is the inconvenience of a limitation being imposed by specific parameters uniquely characteristic of the transistor element.

The present invention contemplates the elimination of this disadvantage and, moreover, the provision of compensation for temperature effect on the oscillation circuit by inserting in the base circuit of the transistor of the oscillation circuit a reactance of appropriate value such that the negative conductance of the output admittance of the transistor as viewed from the load side of the transistor is increased, and, at the same time, reduction of the susceptance is made possible.

The principle of the invention and the manner in which the objects thereof may best be achieved will now be considered in detail.

Referring to FIG. 2, the output admittance $Y_o$ of the transistor when the transistor side is viewed from the output terminals A–B may be expressed as an approximation by the following equation $$Y_0=\frac{1+k(1-\alpha)}{\frac{1}{g\omega C_c}+r_{bb'}[k(1-\alpha)+1]} \qquad (1)$$

where:

$\omega$ is the resonant angular frequency;
$\alpha$ is the emitter-to-collector current amplification factor;
$r_{bb'}$ is the base spreading resistance;
$C_c$ is the collector transition (barrier) capacitance; and
$k$ is the ratio $C_f/C_c$, in which $C_f$ is the feedback capacitance.

Figure 3:
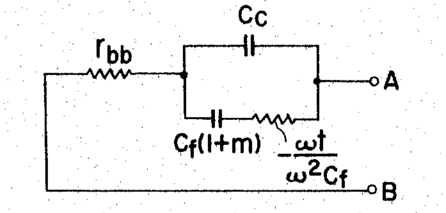
FIG. 3 is an equivalent circuit diagram of the left-hand side as viewed from the terminals A–B shown in FIG. 2.
Figure 5:
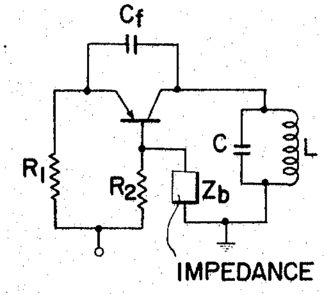
FIG. 5 is a circuit diagram showing a preferred embodiment of the grounded-base transistor oscillator according to the invention.

Accordingly, the circuit shown in FIG. 2 may be represented by the equivalent circuit of FIG. 3, in which the quantity denoted by $\omega_T$ is the characteristic angular frequency of the transistor, and $m$ denotes the excess phase of $\alpha$.

When, in an oscillation circuit of the above described character, an impedance $Z_b$ is inserted between the base and load admittance, the resulting circuit may be considered to be one wherein the impedance $Z_b$ is added in series to the output terminals A–B as will be apparent from FIG. 3.

Then, the output impedance Z as viewed from the terminals A–B may be expressed by the following equation if it is assumed that the reactance component is capacitive.

$$Z=-R-jX \qquad (2)$$

For the case where an inductance element L or a capacitance element C is inserted as the impedance $Z_b$, the output impedance $Z_o$ may be expressed as follows:

$$Z_o=-R-jX\pm jX_b \qquad (3)$$

where:

$+X_b$ is valid when $Z_b$ is an inductance, and
$-X_b$ is valid when $Z_b$ is a capacitance.

By converting this into admittance, the following equation is obtained.

$$Y_o'=\frac{-R+jX(1\mp\eta)}{R^2+X^2(1\mp\eta)^2} \qquad (4)$$

where:

$$\eta=\frac{X_b}{X}$$

If the positive sign of the ratio $\eta$ is here taken to correspond to the direction of increase in the conductance $|g_o|$ of $Y'_o$, $\eta$ must be made a negative symbol. This indicates that, since the reactance component of the output impedance is capacitive, $|g_o|$ will increase if a reactance which is an L component is selected as the impedance $Z_b$.

On one hand, the admittance $Y_o$ in the case when $X_b$ is not added is expressed as follows:

$$Y_o=\frac{1}{-R-jX}\frac{-R+jX}{R^2+X^2} \qquad (5)$$

and by representing the relative ratio of $Y_o/Y$ by $G+jB$, the following relationships are obtained.

$$G=\frac{Y'_o(Re)}{Y_o(Re)}=\frac{A^2+1}{A^2+(1-\eta)^2} \qquad (6)$$

$$B=\frac{Y'_b(Im)}{Y_o(Im)}=\frac{A^2+1}{A^2+(1-\eta)^2}(1-\eta) \qquad (7)$$

where:

$$A=R/X$$

Figures 4, 7:
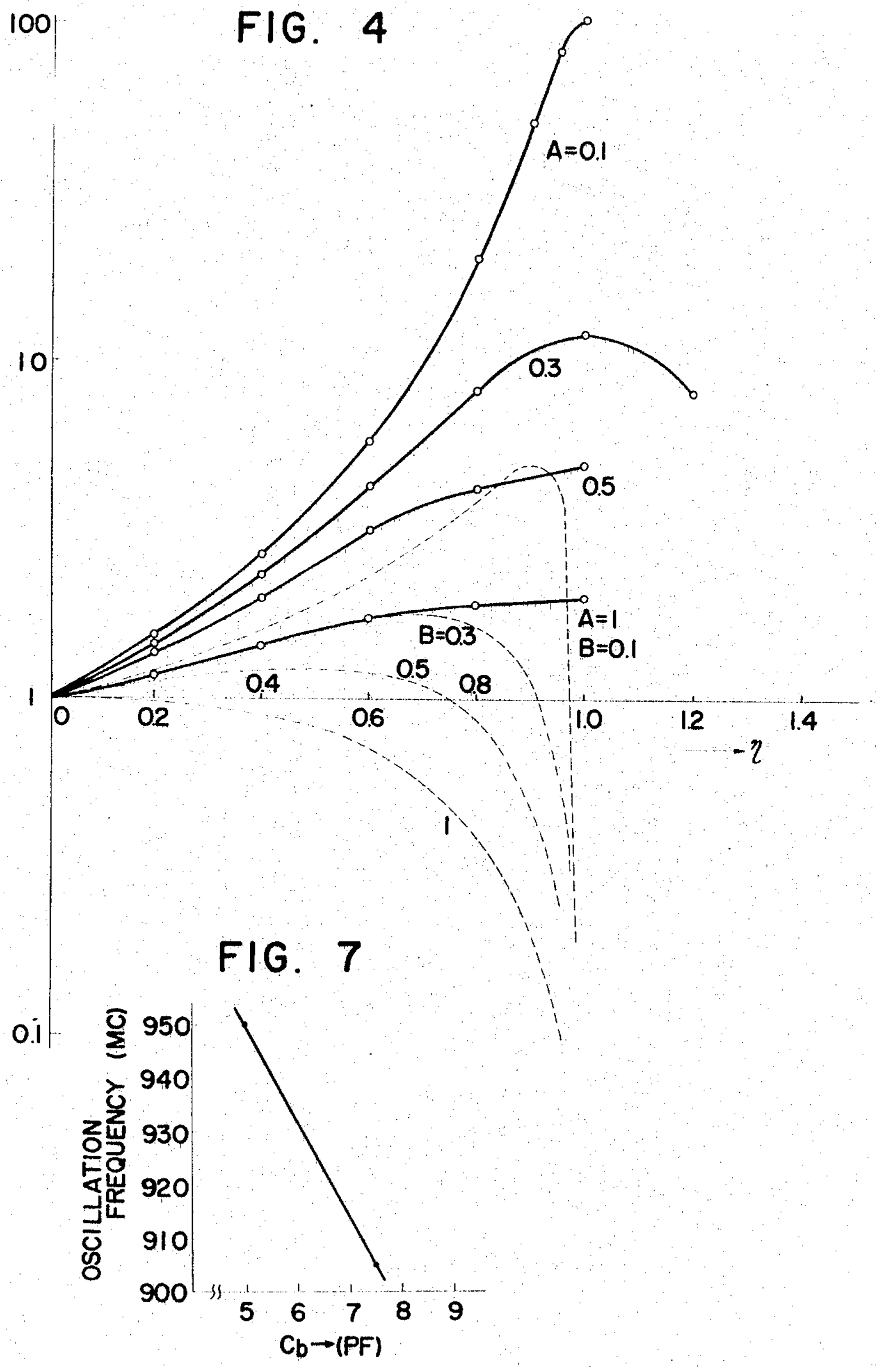
FIG. 4 is a graphical representation indicating characteristic curves to be referred to in the following description of the principle of the invention.

The relationship of Equations 6 and 7 are graphically represented in FIG. 4, in which the full lines represent values of G, and the intermittent lines represent values of B. It is apparent from FIG. 4, that in the case where the reactance part of the output impedance part is a C component, the transistor negative conductance $|g_o|$ is increased by the insertion of an L component into the transistor base circuit. That is, this means that this condition corresponds to $G>1$ in FIG. 4. It is also apparent that, in order to cause, at the same time, a reduction in the C component which is the susceptance component of the transistor, there is an appropriate value of $\eta$ due to the value of $A=R/X$. That is, this indicates that this condition corresponds to the region of $B<1$ in FIG. 4.

Next, the case where the reactance of the output impedance is an L component may be considered in exactly the same manner. The impedance Z' as viewed from the terminals A–B is expressed by the following equation.

$$Z'=-R'+jX'_b \qquad (8)$$

If a reactance of a C component is inserted for $Z_b$, $$Z'_o=-R'+jX'-jX'_b \qquad (9)$$

Computing $G'+jB'$ as before, the following solutions are obtained.

$$G'=\frac{Y'(Re)}{Y_o(Re)}=\frac{A^2+1}{A^2+(1-\eta)^2} \qquad (10)$$

$$B'=\frac{A^2+1}{A^2+(1-\eta)^2}(1-\eta) \qquad (11)$$

Equations 6 and 7 have exactly the same form as Equations 10 and 11; the difference being that, while the susceptance component of Equations 6 and 7 is a C component, that of Equations 10 and 11 is an L component. Accordingly, in the case where the susceptance of a transistor without insertion of $Z_b$ is an L component, the negative conductance $g_o$ is always increased by the insertion of a C component in the base circuit of the transistor, and for reducing the C component constituting the susceptance component (which is equivalent to increasing the L component in this case), the appropriate value of $\eta$ is determined by the value of A. This case, however, corresponds to the region $B'>1$ which is the opposite of the aforedescribed case.

As described above, by selecting C and L of respectively reverse characteristic depending on whether the reactance of the output impedance is an L component or whether it is a C component for $Z_b$ to be inserted into the base circuit of the transistor, it is possible to increase the oscillator output power and elevate the oscillation frequency relative to corresponding values of a conventional grounded-base oscillator of similar type with the same transistor, the same feedback impedance, and the same load.

Next, quantitative problems relating to the impedance $Z_b$ inserted into the base circuit will be considered. For increase in the negative conductance, it is necessary that $\eta<2$ irrespective of the value of A from Equations 6, 7, 10, and 11. More specifically, it is necessary to insert an L or C having a reactance such that $X_b<2X$, that is, having a reverse characteristic reactance (the relationship between the capacitance and inductance being hereinafter considered to be of mutually reverse characteristic) which is twice or less times the output reactance. It is obvious, of course, from FIG. 4 that an L and C to reduce the output susceptance exist within this range.

On this point, furthermore, in the case where the $Z_b$ inserted into the base circuit is a capacitance, this capacitance becomes similar to a conventionally used by-pass capacitor when this impedance is in the vicinity of zero. If, with respect to this state, this $Z_b$ exhibits an impedance as aforedescribed with respect to the oscillation frequency, it is one having the above described effectiveness.

Figure 6:
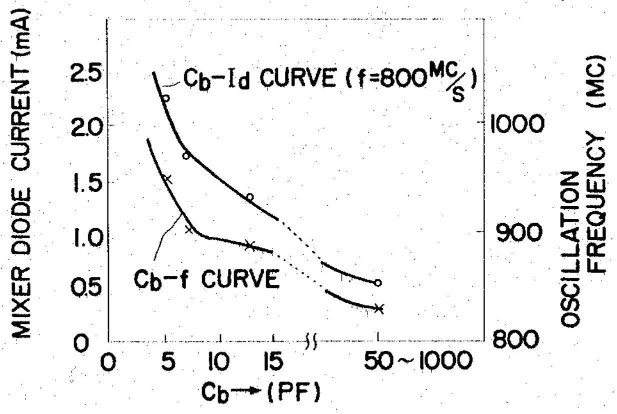
FIGS. 6 and 7 are graphical representations indicating examples of experimental results relating to an embodiment of the invention.

In one actual instance, a grounded-base UHF oscillator was constructed according to the invention with the use of an SE 3001 transistor manufactured by Fairchild. Results of experiments carried out on this oscillator are shown in FIG. 6, from which it will be apparent that the oscillator output power and the oscillation frequency are substantially proportional to the impedance $1/\omega C$.

This result indicates that the above mentioned output susceptance as viewed from the terminals A–B of FIG. 2 is an L component. This result further indicates, together with FIG. 4, that in order to increase the oscillator output power and the oscillation frequency through the effect of $Z_b$ (which is a C component in this case) when the output susceptance as viewed from the terminals A–B toward the transistor is an L component, the available range is that defined by $G>1$ and $B>1$ as described above. Therefore, although the value of A also has some influence, the above increase can be effectively attained by increasing the ratio.

Because $\eta=X_b/X$, the ratio, i.e., the reactance of $X_b$, may be increased. However, a suitable value of $X_b$ which can be determined by the value of A also exists (that is, the range of $B<1$ determined by the value of A). It has been found that in this case, for example, a value which is from 1 to 30 times the value of the transistor $C_c$ is suitable.

While in the foregoing disclosure various unique effects such as the elevation of the oscillation frequency and the increase of the oscillator output power in the oscillator according to the invention have been described, this oscillator also possesses the unique effect of compensating for frequency drift due to temperature variations.

More explicitly, in the case where the added $Z_b$ is a capacitive component, the variation of the oscillation frequency, in general, is proportional to the magnitude of this capacitance $Z_b$. Therefore, by selecting this capacitance $Z_b$ so that it has a suitable temperature coefficient, it is possible to compensate for frequency fluctuation of this transistor oscillator due to temperature variation.

In order to indicate more fully the nature of this compensation, one example of an oscillator in which $Z_b$ is used as an element to compensate for frequency drift due to temperature variation of a transistor is presented herebelow.

An experimental result of measurements of $C_b$ which is equal to $1/j\omega Z_b$ and oscillation frequency for oscillation frequencies in the neighborhood of 930 mc./s. in the case of a grounded-base oscillator according to the invention in which a Fairchild SE-3001 transistor was used is indicated in FIG. 7. At 930 mc./s., $C_b$ is 6.1 pf. Then, if there is a temperature change, variations in the transistor parameters and the resonant tank circuits will occur. In the case when the temperature rises 50 degrees C. above room temperature, and the temperature coefficient of $C_b$ is zero, the oscillator frequency becomes approximately 925 mc./s.; that is, a frequency drop of 5 mc./s. occurs.

In this case, if the value of $C_b$ is varied from 6.1 pf. to 5.8 pf. in order to cause an increase of 5 mc./s. in the oscillator frequency according to FIG. 7, the frequency can be maintained at the original 930 mc./s. That is, in order to maintain the oscillator frequency in this case constant irrespective of the temperature rise, the required variation in the value of $C_b$ is from 6.1 pf. to 5.8 pf. with respect to a temperature rise of 50 degrees C. from room temperature. Therefore, $$\frac{\partial c_b}{c} \Big/ \partial T = \frac{5.8-6.1}{6.1} \Big/ 50 = -2\times 10^4$$

That is, the frequency can be maintained constant by selecting a fixed capacitance having a temperature constant of negative value of the above solution.

For the UHF band, since it is necessary to select amply small values for the aforementioned $C_c$ and $C_f$ or the output susceptance of the transistor, the oscillator frequency fluctuation due to temperature variation of the $C_c$ of the transistor has a great influence. However, by using here a $C_b$ having a temperature coefficient which is of opposite sign relative to that of $C_c$, it is possible to increase the frequency stability of the oscillator with respect to temperature variations. This point is another important advantage afforded by the present invention.

It should be understood, of course, that the foregoing disclosure relates to only a preferred embodiment of the invention and that it is intended to cover all changes and modifications of the example of the invention herein chosen for the purposes of the disclosure, which do not constitute departures from the spirit and scope of the invention as set forth in the appended claims.

What we claim is:

1. A transistor oscillator which comprises: a transistor having a base, a collector and an emitter; a resonant circuit connected between said collector and the ground; an element connected across said collector and emitter generating a feedback; means to impart bias voltage; and a reactance element inserted between the base of said transistor and ground having reactance of a characteristic which is opposite to that of the reactance produced between the collector and base of said transistor and of a value which is at the most approximately twice the value of said reactance produced between the collector and base of said transistor, whereby negative conductance, when the transistor is viewed from said resonant circuit, is made sufficiently great.

2. The transistor oscillator as defined in claim 1, wherein the reactance element inserted between the base of said transistor and the ground has a temperature coefficient which compensates for the frequency drift due to temperature variation of said oscillator.

3. The transistor oscillator as defined in claim 1, wherein the reactance element inserted between the base of said transistor and the ground has a temperature coefficient of equal absolute value as, but of opposite algebraic sign relative to, the temperature coefficient of the barrier capacitance of the collector of said transistor, thereby compensating for frequency drift due to temperature variation of said oscillator.

References Cited by the Examiner

UNITED STATES PATENTS 2,704,792 3/1955 Eberhard et al. ------ 330—12

OTHER REFERENCES

Vodicka: Electronics "Transistor Operation Beyond Cutoff Frequency," Aug. 26, 1960, pp. 56–60.

NATHAN KAUFMAN, *Primary Examiner.*

J. KOMINSKI, *Assistant Examiner.*